US012771322B2

(12) United States Patent
Yang

(10) Patent No.: US 12,771,322 B2
(45) Date of Patent: Oct. 20, 2026

(54) RADIO FREQUENCY FILTER WITH RESONATORS

(71) Applicant: RichWave Technology Corp., Taipei City (TW)

(72) Inventor: Chin-Lung Yang, Taipei City (TW)

(73) Assignee: RichWave Technology Corp., Taipei City (TW)

( * ) Notice: Subject to any disclaimer, the term of this patent is extended or adjusted under 35 U.S.C. 154(b) by 39 days.

(21) Appl. No.: 18/979,514

(22) Filed: Dec. 12, 2024

(65) Prior Publication Data

US 2026/0135543 A1 May 14, 2026

(30) Foreign Application Priority Data

Nov. 14, 2024 (TW) ................................ 113143698

(51) Int. Cl.
*H03H 9/54* (2006.01)
*H03H 9/00* (2006.01)
*H03H 9/56* (2006.01)

(52) U.S. Cl.
CPC .......... *H03H 9/542* (2013.01); *H03H 9/0014* (2013.01); *H03H 9/568* (2013.01)

(58) Field of Classification Search
CPC ...... H03H 9/542; H03H 9/0014; H03H 9/568; H03H 9/6483; H03H 7/0115; H03H 9/605; H03H 9/725; H03H 7/1766; H03H 9/706; H03H 7/09; H03H 7/1758; H03H 7/1775; H03H 9/205; H03H 7/0161; H03H 7/463; H03H 9/72; H03H 9/54; H03H 7/1708; H03H 7/075; H03H 2007/013; H03H 9/6403; H03H 7/38; H03H 2210/025; H03H 7/175; H03H 7/12; H02J 50/12; H02J 50/80; H02J 50/40; H02J 50/402; H02J 50/60; H02J 50/70; H02J 50/50;
(Continued)

(56) References Cited

U.S. PATENT DOCUMENTS 11,563,423 B2 * 1/2023 Komatsu ............ H03H 9/02866
12,549,156 B2 * 2/2026 Qin ........................ H03H 9/605
(Continued)

FOREIGN PATENT DOCUMENTS

WO 2016/158954 A1 10/2016

OTHER PUBLICATIONS

Office action mailed on Jul. 9, 2025 for the Taiwan application No. 113143698, filing date Nov. 14, 2024, p. 1-12, Jul. 9, 2025.

*Primary Examiner* — John W Poos
(74) *Attorney, Agent, or Firm* — Winston Hsu

(57) ABSTRACT

A radio frequency filter includes a first transceiving terminal, a second transceiving terminal, a first series resonator, at least one first parallel resonator, at least one second parallel resonator, a first capacitor, a second capacitor, a first inductor, a second inductor and a third inductor. The at least one first parallel resonator is coupled in parallel with the first capacitor and couples the first series resonator to a first node. The at least one second parallel resonator is coupled in parallel with the second capacitor and couples the first series resonator to a second node. The first inductor is coupled to the first transceiving terminal. The second inductor is coupled to the second transceiving terminal. The third inductor is coupled between the first inductor and a reference node and between the second inductor and the reference node.

17 Claims, 4 Drawing Sheets

(58) Field of Classification Search

CPC .. H02J 50/90; H02J 50/005; H02J 7/00; H02J 7/35; H02J 2105/30; H02J 7/70; H02J 50/23; H02J 7/65; H02J 7/42; H02J 50/05; H02J 7/54; H02J 7/731; H02J 2207/20; H02J 3/01; H02J 7/02; H02J 7/61; H02J 7/80; H02J 7/933; H03F 2200/451; H03F 3/195; H03F 2200/294; H03F 3/245; H03F 1/565; H03F 3/19; H03F 2200/222; H03F 3/21; H03F 2200/111; H03F 3/72; H03F 3/193; H03F 2200/165; H03F 2203/7209; H03F 2200/171; H03F 2200/387; H03F 3/189; H03F 3/24; H03F 1/56; H03F 2203/21157; H03F 2200/391; H03F 3/211; H03F 1/0205; H03F 3/68; H03F 1/223; H03F 1/26; H03F 1/0288; H03F 3/20; H03F 1/0211; H03F 2200/225; H03F 2200/541; H03F 3/213; H03F 1/0222; H03F 1/3205; H03F 2200/12; H03F 2200/267; H03F 2200/372; H03F 2200/402; H03F 3/217; H03F 3/2176; H03F 3/601; H03F 3/602; H03F 1/30; H03F 2200/318; H03F 2200/537; H03F 3/191; H03F 1/086; H03F 1/32; H03F 1/3247; H03F 19/00; H03F 2200/168; H03F 2200/181; H03F 2200/255; H03F 2200/423; H03F 2200/489; H03F 2200/492; H03F 2200/61; H03F 2200/63; H03F 2203/21139; H03F 3/08; H03F 3/082; H03F 3/2171; H03F 3/2173; H03F 3/45475; H03F 3/60; H03F 3/62; H03F 3/66; H03F 1/0294; H03F 1/483; H03F 1/52; H03F 2200/243; H03F 2200/246; H03F 2200/36; H03F 2200/378; H03F 2203/45034; H03F 2203/45156; H03F 2203/45201; H03F 2203/7239; H03F 3/45179

See application file for complete search history.

(56) References Cited

U.S. PATENT DOCUMENTS

| | | | | |
|---|---|---|---|---|
| 2010/0283555 | A1 | 11/2010 | Tanaka | |
| 2014/0266511 | A1* | 9/2014 | Turner | G06F 30/327<br>716/104 |
| 2021/0265979 | A1* | 8/2021 | Inoue | H03H 9/0542 |
| 2024/0097651 | A1 | 3/2024 | Ogawa | |

* cited by examiner

RADIO FREQUENCY FILTER WITH RESONATORS

TECHNICAL FIELD

The present invention relates to a radio frequency filter, and in particular to a radio frequency filter including series resonators, parallel resonators, capacitors and inductors.

BACKGROUND

As communication technology advances, mobile phones and wireless devices are now supporting an increasing number of frequency bands to enhance signal coverage and enable international roaming. With the rapid proliferation of wireless devices, the demand for compact and lightweight resonators and filters is growing significantly.

Acoustic wave devices, including surface acoustic wave (SAW) and bulk acoustic wave (BAW) devices, are extensively utilized for converting and transmitting electrical and acoustic signals. These devices may be used in a wide range of applications. For instance, an acoustic wave device may function as filters to filter out noise, so as to preserve wireless signals within a specific frequency band. Acoustic wave devices are favored in various communication products at least due to their low transmission loss, excellent anti-electromagnetic interference performance, and compact size. Additionally, they may also be employed in resonators, transformers, sensors, etc. Filters comprising acoustic devices may operate at both high and low frequencies, offering benefits such as reduced size, enhanced performance, and improved cost-effectiveness.

For instance, a ladder-type radio frequency filter may incorporate a series resonator and a parallel resonator. Film Bulk Acoustic Resonators (FBARs) may be utilized to achieve desirable characteristics at high frequencies, such as an improved quality factor. Additionally, RF filters may include passive components such as capacitors and inductors to optimize performance for specific frequency bands, such as the n41 frequency band used in 5G.

SUMMARY

An embodiment of the present invention may provide a radio frequency filter including a first transceiving terminal, a second transceiving terminal, a first series resonator, at least one first parallel resonator, at least one second parallel resonator, a first capacitor, a second capacitor, a first inductor, a second inductor and a third inductor. The first series resonator is coupled between the first transceiving terminal and the second transceiving terminal. The first terminal of the at least one first parallel resonator is coupled to the first series resonator, and the second terminal of the at least one first parallel resonator is coupled to a first node. The first terminal of the at least one second parallel resonator is coupled to the first series resonator, and the second terminal of the at least one second parallel resonator is coupled to a second node. The first capacitor is coupled in parallel with the at least one first parallel resonator. The second capacitor is coupled in parallel with the at least one second parallel resonator. The first terminal of the first inductor is coupled to the first transceiving terminal. The first terminal of the second inductor is coupled to the second transceiving terminal. The first terminal of the third inductor is coupled to the second terminal of the first inductor and coupled to the second terminal of the second inductor, and the second terminal of the third inductor is coupled to a reference node.

Another embodiment of the present invention may provide a radio frequency filter including a first transceiving terminal, a second transceiving terminal, a first series resonator, at least one first parallel resonator, at least one second parallel resonator, a first inductor, a second inductor, a third inductor. The first series resonator is coupled between the first transceiving terminal and the second transceiving terminal. The first terminal of the at least one first parallel resonator is coupled to the first series resonator, and the second terminal of the at least one first parallel resonator is coupled to a first node. The first terminal of the at least one second parallel resonator is coupled to the first series resonator, and the second terminal of the at least one second parallel resonator is coupled to a second node. The first terminal of the first inductor is coupled to the first transceiving terminal. The first terminal of the second inductor is coupled to the second transceiving terminal. The first terminal of the third inductor is coupled to the second terminal of the first inductor and coupled to the second terminal of the second inductor, and the second terminal of the third inductor is coupled to a reference node. The first inductor has a first inductance, the second inductor has a second inductance, and the first inductance is substantially equal to the second inductance.

DETAILED DESCRIPTION

Figure 1:
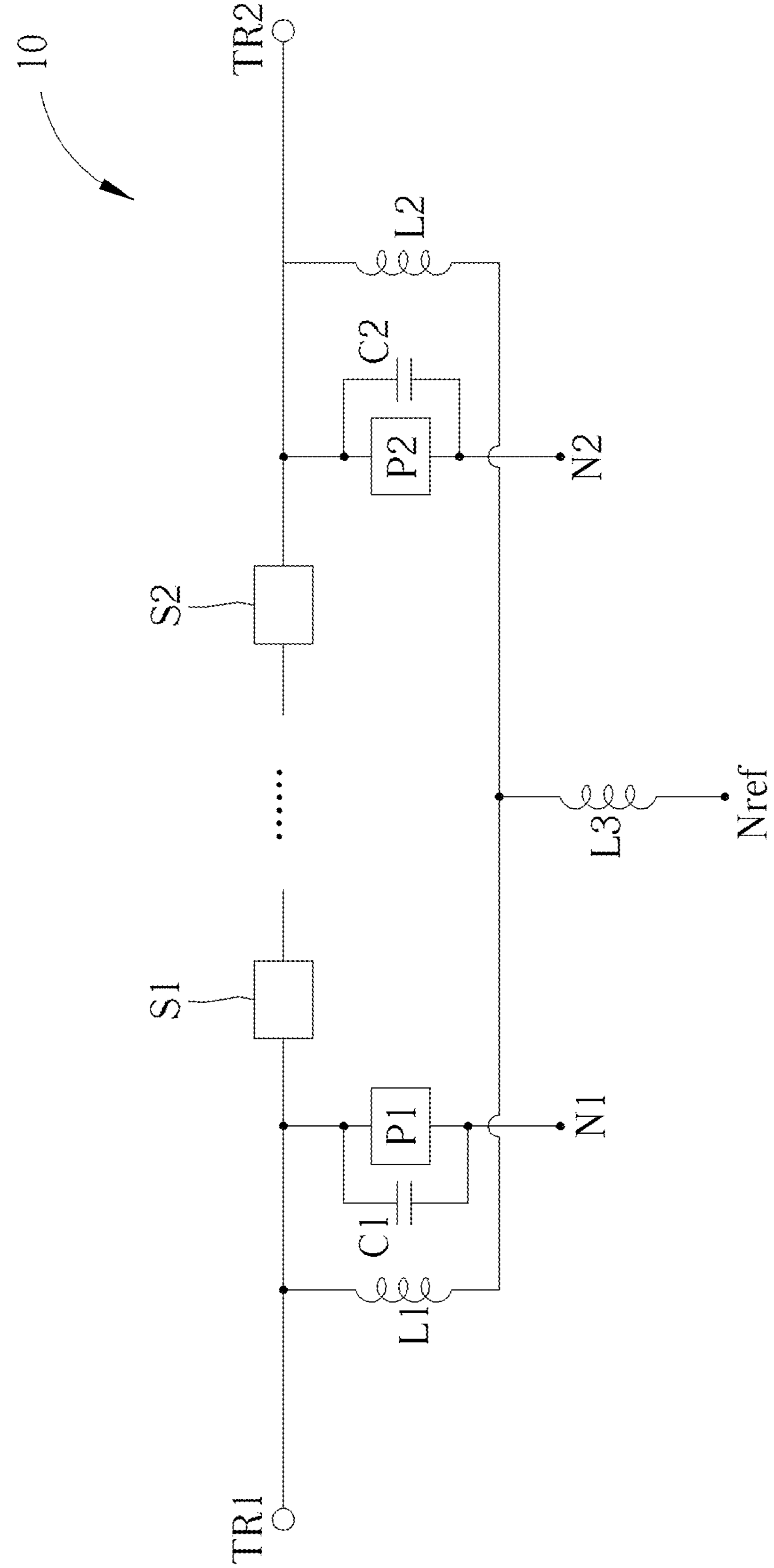
FIG. 1 is a circuit diagram of a radio frequency filter according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts may be omitted for clarity, and like reference numerals refer to like elements throughout.

The present invention may be understood by referring to the following detailed description in conjunction with the accompanying drawings. It should be noted that, for clarity and conciseness, the drawings may only depict a portion of the electronic device, and certain elements may be not drawn to scale. Additionally, the number and size of components in the figures may be for illustrative purposes only and may be not intended to limit the scope of the invention. Components marked with the same symbols in the drawings have the same or similar properties or functions as described in the following context.

It should be noted that the following embodiments may be replaced, reorganized, and combined with features from various embodiments without departing from the spirit of the present invention. The features of each embodiment may be used individually or in combination, provided they do not violate the spirit of the invention. In the following description and claims, terms such as “include,” “contain,” and “have” may be open-ended and should be interpreted to mean “including but not limited to.” Therefore, when these terms may be used in the description of the present invention, they indicate the presence of the corresponding features, regions, steps, operations, and/or components, but do not exclude the presence of additional features, regions, steps, operations, and/or components.

FIG. 1 is a circuit diagram of a radio frequency filter 10 according to an embodiment of the present invention. In some embodiments, the radio frequency filter 10 may include a first transceiving terminal TR1, a second transceiving terminal TR2, a first series resonator S1, and a second series resonator S2. The first transceiving terminal TR1 may be used to receive the input radio frequency signal, and the second transceiving terminal TR2 may be used to transmit the output radio frequency signal. The radio frequency signal is transmitted from the first transceiving terminal TR1 to the second transceiving terminal TR2 and is filtered by the radio frequency filter 10 to preserve radio frequency signals in a specific frequency band. However, the present invention is not limited thereto. In other embodiments, the second transceiving terminal TR2 may be used to receive the input radio frequency signal, and the first transceiving terminal TR1 may be used to transmit the output radio frequency signal. Furthermore, the radio frequency filter 10 may include a series path and a parallel path coupled between the first transceiving terminal TR1 and the second transceiving terminal TR2. In detail, the series path may include the first series resonator S1 and the second series resonator S2. As shown, the first terminal of the first series resonator S1 may be coupled to the first transceiving terminal TR1, and the second terminal may be coupled to the second series resonator S2. The first terminal of the second series resonator S2 may be coupled to the first series resonator S1, and the second terminal of the second series resonator S2 may be coupled to the second transceiving terminal TR2. In other words, the first series resonator S1 and the second series resonator S2 may be serially coupled between the first transceiving terminal TR1 and the second transceiving terminal TR2.

In some embodiments, the parallel path of the radio frequency filter 10 may include at least one first parallel resonator P1 and at least one second parallel resonator P2. As shown, the first parallel resonator P1 may include a first terminal and a second terminal. The first terminal may be coupled to the first terminal of the first series resonator S1, and the second terminal may be coupled to a first node N1. In other embodiments, the first terminal of the first parallel resonator P1 may also be coupled to the second terminal of the first series resonator S1. Similarly, a first terminal of the second parallel resonator P2 may be coupled to the second series resonator S2 (e.g., coupled to the first terminal or the second terminal of the second series resonator S2), and the second terminal of the second parallel resonator P2 may be coupled to the second node N2. In at least one of above embodiments, as shown, the first parallel resonator P1 and the second parallel resonator P2 are shown as a single resonator. However, the present invention is not limited thereto. In other embodiments, the parallel resonators P1 or P2 may each include a plurality of series-connected resonators. In some embodiments, the first node N1 and/or the second node N2 may be further directly or indirectly coupled to a reference voltage terminal, and the reference voltage terminal may be, for example, a grounded terminal.

In some embodiments, a resonator may include a surface acoustic wave (SAW) resonator, a bulk acoustic wave (BAW) resonator, or other suitable type of resonator. The RF filter 10 may be configured as a low-pass, high-pass, band-pass, or band-stop filter. For instance, in the case of a high-pass filter, the resonators in the RF filter 10 may filter out lower frequency RF signals, allowing higher frequency signals (e.g., above a predetermined frequency) to pass through. Further, the predetermined frequency may be determined based on the equivalent capacitance of various resonators. Additionally, each resonator may have a resonant frequency determined by its material and various parameters. For example, a film bulk acoustic resonator (FBAR) including a piezoelectric film may have its resonant frequency determined by the material selected for and the thickness of the piezoelectric film.

For example, a film bulk acoustic resonator (FBAR) may include a substrate, a lower electrode, a piezoelectric film, an upper electrode, and a passivation layer. The substrate may comprise materials such as silicon (Si) or quartz, providing structural support. The lower or upper electrode may be disposed on the substrate, and may generally include metals such as molybdenum (Mo), copper (Cu), aluminum (Al), gold (Au), platinum (Pt), tungsten (W), or various combinations thereof. The piezoelectric film may be disposed between the lower and upper electrodes, and may include materials such as zinc oxide (ZnO), aluminum nitride (AlN), lithium tantalate (LiTaO3, LT), lithium niobate (LN), quartz (QZ), lead titanate ($PbTiO_3$, PTO), lead zirconate titanate ($Pb[Zr_xTi_{1-x}]O_3$ ($0 \le x \le 1$), PZT), or their various combinations. The passivation layer may be disposed on the upper electrode to function as a protective film. The passivation layer may protect the structure to maintain some electrical characteristics.

In some embodiments, the resonant frequency of the FBAR may be determined by the physical dimensions and material properties of the piezoelectric film. By changing the size and/or thickness of the piezoelectric film, different resonant frequencies may be achieved. Film bulk acoustic resonators offer high frequency stability and quality factor, providing accurate output frequency.

In some embodiments, the radio frequency filter 10 may further include a first capacitor C1, a second capacitor C2, a first inductor L1, a second inductor L2, and a third inductor L3. As shown, the first capacitor C1 may be coupled in parallel with the first parallel resonator P1, and the second capacitor C2 may be coupled in parallel with the second parallel resonator P2. The first inductor L1 may include a first terminal and a second terminal, the first terminal may be coupled to the first transceiving terminal TR1, and the second terminal may be coupled to the third inductor L3. Similarly, the first terminal of the second inductor L2 may be coupled to the second transceiving terminal TR2, and the second terminal may be coupled to the third inductor L3. Furthermore, the third inductor L3 may include a first terminal and a second terminal. The first terminal of the third inductor L3 may be coupled to the second terminal of the first inductor L1 and may be coupled to the second terminal of the second inductor L2, and the second terminal of the third inductor L3 may be coupled to the reference node Nref. Similar to the first node N1 and/or the second node N2, the reference node Nref may be further directly or indirectly coupled to a reference voltage terminal, which may be, for example, a grounded terminal.

For example, the inductor may include a planar inductor, a three-dimensional inductor, some components with parasitic inductance, etc. The first inductor L1 may have a first inductance vl1, and the second inductor L2 may have a second inductance vl2. Furthermore, the first inductance vl1 may be substantially equal to the second inductance vl2. Furthermore, the capacitance of the first capacitor C1 may be substantially equal to the capacitance of the second capacitor C2. In some embodiments, the combination of the first capacitor C1 and the second capacitor C2 may be used to eliminate or weaken the impact from the second and/or the third harmonics, thereby providing a better filtering effect for the desired frequency band. Furthermore, the combination of the first inductor L1, the second inductor L2 and the third inductor L3 may be used to adjust the zero point of the lower out-band (i.e., the band lower than the target frequency band) for the RF filter 10, so as to effectively filter out unwanted low-frequency signals. This enables the radio frequency filter 10 to provide better filtering effect for a desired frequency band.

Figure 2:
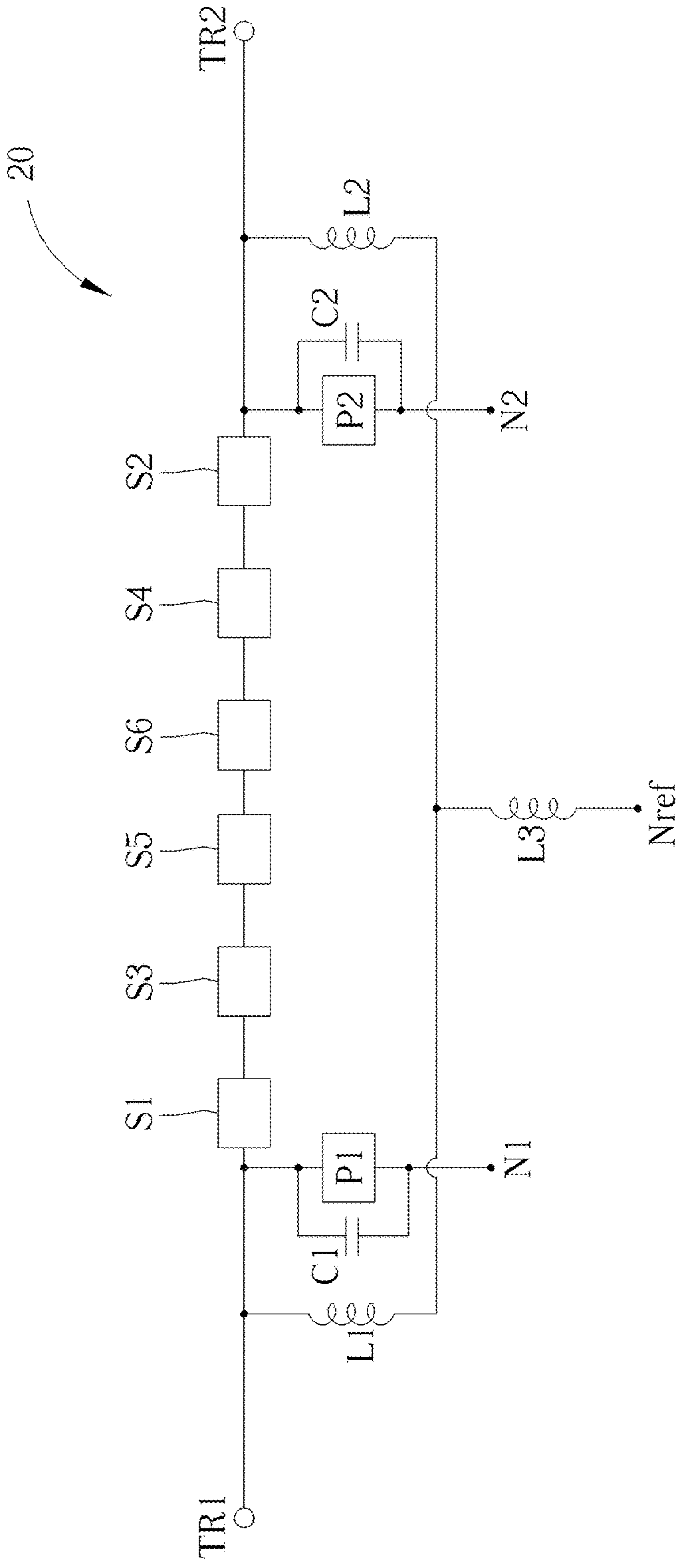
FIG. 2 is a circuit diagram of a radio frequency filter according to another embodiment of the present invention.

FIG. 2 is a circuit diagram of a radio frequency filter 20 according to another embodiment of the present invention. The radio frequency filter 20 may be similar to the radio frequency filter 10, and the similarities will not be described in detail. Only differences will be described as follows. In some embodiments, in the radio frequency filter 20, the series path may further include a third series resonator S3, a fourth series resonator S4, a fifth series resonator S5, and a sixth series resonator S6. Specifically, the third series resonator S3 may be coupled in series between the first series resonator S1 and the second series resonator S2. The fourth series resonator S4 may be coupled in series between the third series resonator S3 and the second series resonator S2. The fifth series resonator S5 may be coupled in series between the third series resonator S3 and the fourth series resonator S4. The sixth series resonator S6 may be coupled in series between the fifth series resonator S5 and the fourth series resonator S4. In other words, as shown, the first series resonator S1, the third series resonator S3, the fifth series resonator S5, the sixth series resonator S6, the fourth series resonator S4, and the second series resonator S2 may be coupled in series between the first transceiving terminal TR1 and the second transceiving terminal TR2.

Figure 3:
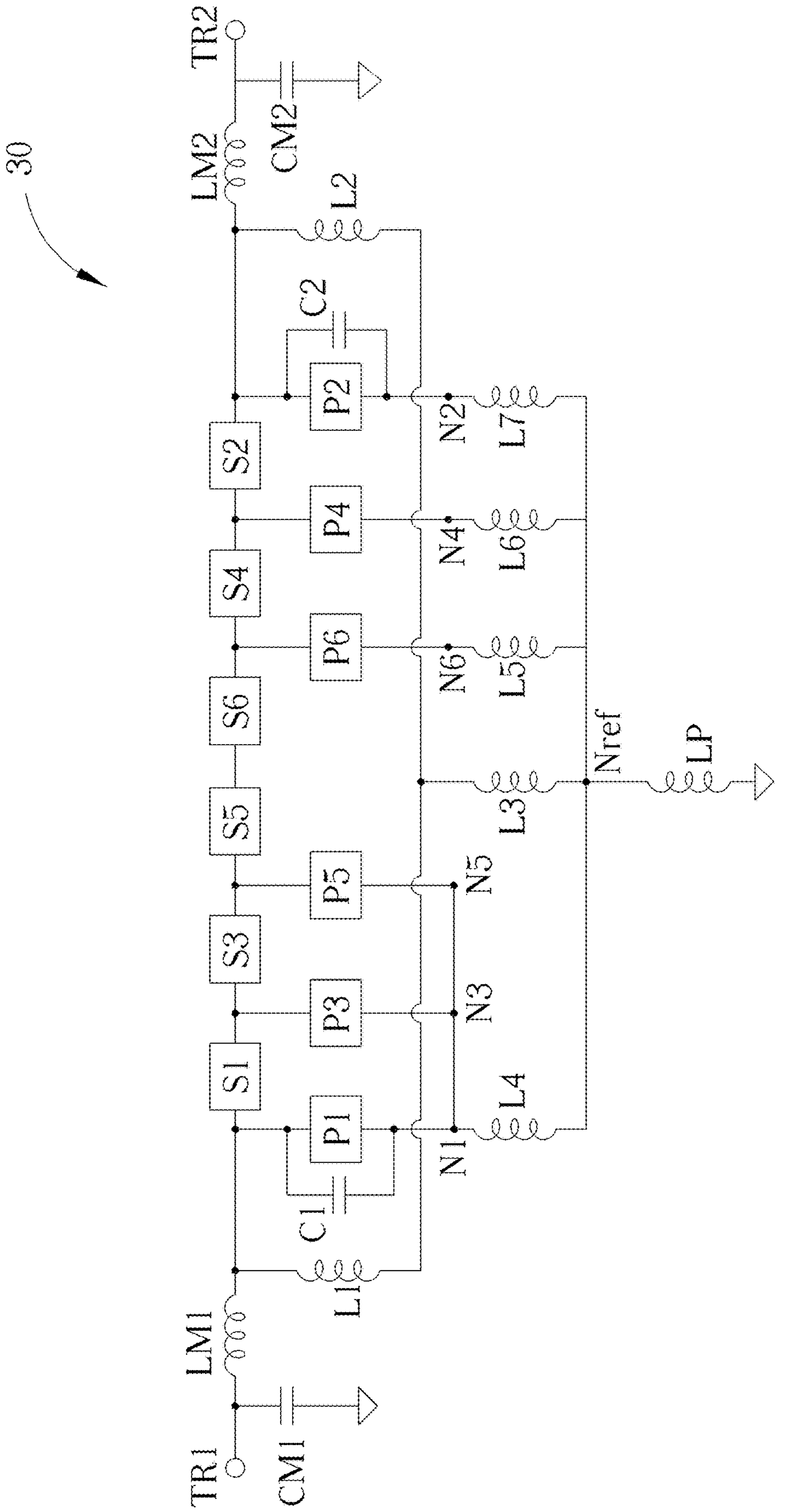
FIG. 3 is a circuit diagram of a radio frequency filter according to another embodiment of the present invention.

FIG. 3 is a circuit diagram of a radio frequency filter 30 according to another embodiment of the present invention. The radio frequency filter 30 may be similar to the radio frequency filter 10 and/or the radio frequency filter 20, and the similarities will not be described in detail. Only differences will be described as follows.

In some embodiments, in the radio frequency filter 30, the parallel path may further include a third parallel resonator P3, a fourth parallel resonator P4, a fifth parallel resonator P5, and a sixth parallel resonator P6. In detail, the third parallel resonator P3 may include a first terminal and a second terminal. The first terminal may be coupled between the first series resonator S1 and the third series resonator S3, and the second terminal may be coupled to a third node N3. Similarly, the first terminal of the fourth parallel resonator P4 may be coupled between the second series resonator S2 and the fourth series resonator S4, and the second terminal may be coupled to a fourth node N4. The first terminal of the fifth parallel resonator P5 may be coupled between the third series resonator S3 and the fifth series resonator S5, and the second terminal may be coupled to a fifth node N5. The first terminal of the sixth parallel resonator P6 may be coupled between the fourth series resonator S4 and the sixth series resonator S6, and the second terminal may be coupled to a sixth node N6. In further embodiments, the radio frequency filter 30 may further include a parallel path coupled between the fifth series resonator S5 and the sixth series resonator S6.

Furthermore, the radio frequency filter 30 may also include a fourth inductor L4, a fifth inductor L5, a sixth inductor L6, and a seventh inductor L7. As shown, the fourth inductor L4 may include a first terminal and a second terminal, and the first terminal may be coupled to the first node N1, the third node N3, and the fifth node N5. The second terminal of the fourth inductor L4 may be coupled to the reference node Nref. The fifth inductor L5 may include a first terminal and a second terminal, the first terminal may be coupled to the sixth node N6, and the second terminal may be coupled to the reference node Nref. Similarly, the first terminal of the sixth inductor L6 may be coupled to the fourth node N4, and the second terminal may be coupled to the reference node Nref. The first terminal of the seventh inductor L7 may be coupled to the second node N2, and the second terminal may be coupled to the reference node Nref. Furthermore, the radio frequency filter 30 may also include a parasitic inductor Lp, which is present between the reference node Nref and the reference voltage terminal. In one embodiment, the parasitic inductor Lp may be formed due to the parasitic inductance of the circuit board, such as a printed circuit board.

In the embodiment shown in FIG. 3, nodes N1, N3, and N5 are coupled to the reference node Nref via a common inductor (for example, the fourth inductor L4), while nodes N6, N4, and N2 are coupled to the reference node Nref via respective inductors (for example, inductors L5, L6, and L7). However, this is only shown as an example, and the embodiment is not limited thereto. In other embodiments, each of the nodes N1 to N6 may be coupled to the reference node Nref via respective inductors, or at least two of them may be coupled to the reference node Nref via a common inductor.

In some embodiments, the first series resonator S1 may have an equivalent capacitance VC1, the second series resonator S2 may have an equivalent capacitance VC2, and the equivalent capacitance VC1 may be substantially equal to the equivalent capacitance VC2. Furthermore, the first series resonator S1 may have a first resonant frequency f1, the second series resonator S2 may have a second resonant frequency f2, and the first resonant frequency f1 may be substantially equal to the second resonant frequency f2. Furthermore, the third series resonator S3 may have an equivalent capacitance VC3, the fourth series resonator S4 may have an equivalent capacitance VC4, and the equivalent capacitance VC3 may be substantially equal to the equivalent capacitance VC4. The third series resonator S3 may have a third resonant frequency f3, the fourth series resonator S4 may have a fourth resonant frequency f4, and the third resonant frequency f3 may be substantially equal to the fourth resonant frequency f4. Furthermore, the fifth series resonator S5 may have an equivalent capacitance VC5, the sixth series resonator S6 may have an equivalent capacitance VC6, and the equivalent capacitance VC5 may be substantially equal to the equivalent capacitance VC6. The fifth series resonator S5 may have a fifth resonant frequency f5, the sixth series resonator S6 may have a sixth resonant frequency f6, and the fifth resonant frequency f5 may be substantially equal to the sixth resonant frequency f6. For example, being substantially equal may be defined as a difference less than ±20%, preferably less than ±10%, and more preferably less than ±5%.

In further embodiments, the first parallel resonator P1 may have an equivalent capacitance VCP1, the second parallel resonator P2 may have an equivalent capacitance VCP2, and the equivalent capacitance VCP1 may be substantially equal to the equivalent capacitance VCP2. Furthermore, the first parallel resonator P1 may have a first resonant frequency fp1, the second parallel resonator P2 may have a second resonant frequency fp2, and the first resonant frequency fp1 may be substantially equal to the second resonant frequency fp2. Furthermore, the third parallel resonator P3 may have an equivalent capacitance VCP3, the fourth parallel resonator P4 may have an equivalent capacitance VCP4, and the equivalent capacitance VCP3 may be substantially equal to the equivalent capacitance VCP4. The third parallel resonator P3 may have a third resonant frequency fp3, the fourth parallel resonator P4 may have a fourth resonant frequency fp4, and the third resonant frequency fp3 may be substantially equal to the fourth resonant frequency fp4. Furthermore, the fifth parallel resonator P5 may have an equivalent capacitance VCP5, the sixth parallel resonator P6 may have an equivalent capacitance VCP6, and the equivalent capacitance VCP5 may be substantially equal to the equivalent capacitance VCP6. The fifth parallel resonator P5 may have a fifth resonant frequency fp5, the sixth parallel resonator P6 may have a sixth resonant frequency fp6, and the fifth resonant frequency fp5 may be substantially equal to the sixth resonant frequency fp6.

In some embodiments, the radio frequency filter 30 may further include a first matching circuit and a second matching circuit. The first matching circuit may be coupled between the first transceiving terminal TR1 and the first series resonator S1, and the second matching circuit may be coupled between the second transceiving terminal TR2 and the second series resonator S2. As shown, for example, the first matching circuit may include a first matching inductor LM1 in a series path and a first matching capacitor CM1 in a parallel path, so as to achieve the purpose of impedance matching. Thus, the input impedance of the first transceiving terminal TR1 may be matched to the RF filter, so as to reduce reflections of RF signals. Similarly, the second matching circuit may include a second matching inductor LM2 in a series path and a second matching capacitor CM2 in a parallel path. The second matching circuit may be configured for impedance matching by connecting the second matching inductor LM2 in series and the second matching capacitor CM2 in parallel. The purpose of impedance matching may be achieved, and thus the output impedance of the second transceiving terminal TR2 may be matched to the radio frequency filter, so as to reduce reflection of radio frequency signals. In other embodiments, the implementation of the first and/or second matching circuit may also include a matching capacitor in a series path and/or a matching inductor in a parallel path. Further, one or more elements described above may be omitted from the first and/or second matching circuit, or an additional element may be implemented in the first and/or second matching circuit.

Figure 4:
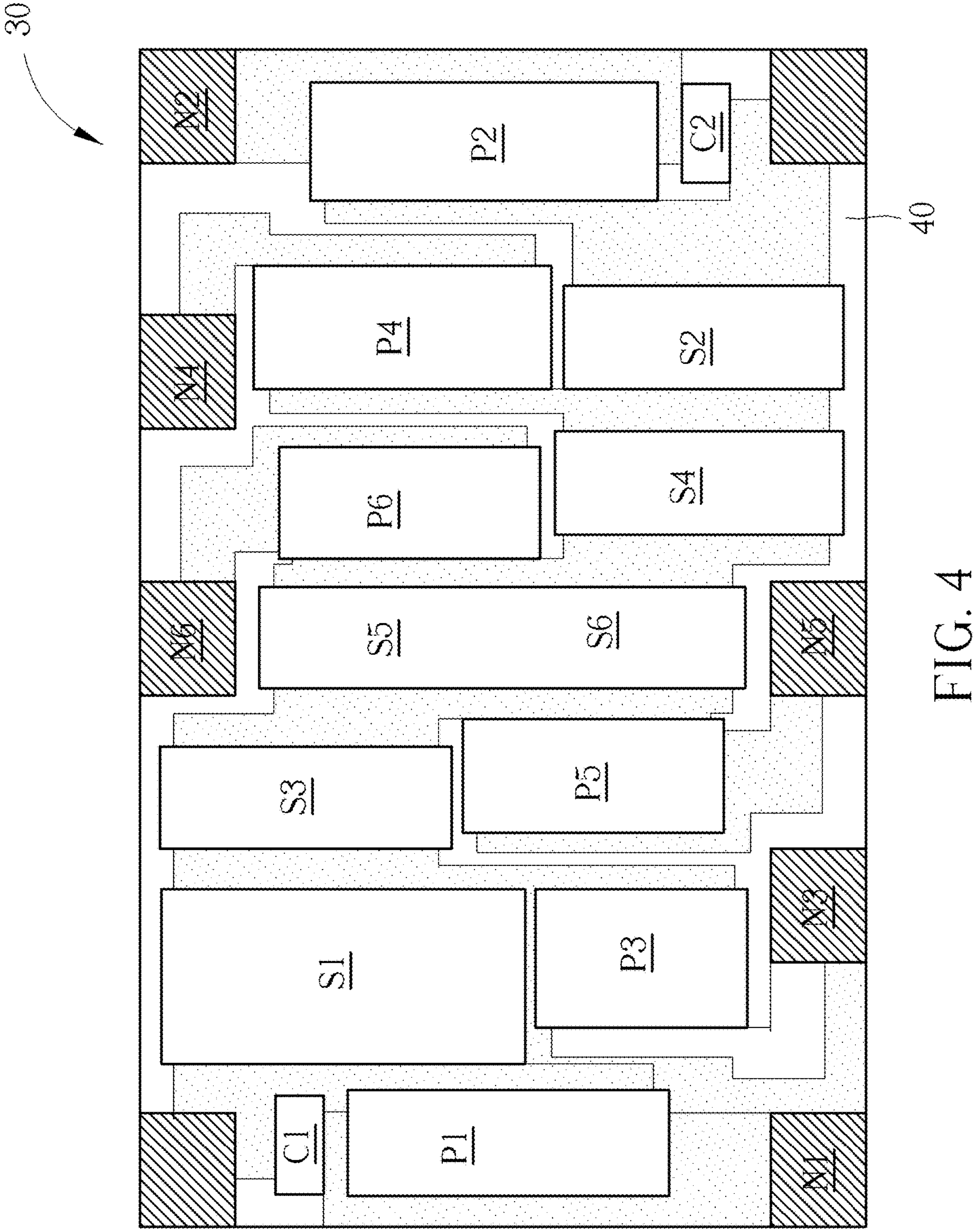
FIG. 4 is an exemplary layout diagram of a radio frequency filter according to an embodiment of the present invention.

FIG. 4 is an exemplary layout diagram of a radio frequency filter according to an embodiment of the present invention. The layout diagram of FIG. 4 is shown for example by referring to the radio frequency filter 30 of FIG. 3. Specifically, various components included in the radio frequency filter 30 may be disposed on a plurality of substrates. For example, series resonators S1~S6, parallel resonators P1~P6, capacitors C1~C2, and nodes N1~N6 may be provided on a first substrate, and other components (such as inductors L1~L3) may be provided on other substrates (for example, a second and/or third substrate). The first substrate 40 may be, for example, a piezoelectric wafer. The second substrate may be, for example, a 4-Layer Bismaleimide-Triazine resin substrate, i.e., a BT substrate, and its size may be, for example, 1.4 mm×1.1 mm.

FIG. 4 shows the first substrate with series resonators S1~S6, parallel resonators P1~P6, capacitors C1~C2, and nodes N1~N6 disposed thereon. As shown, in some embodiments, the first substrate 40 may be substantially shaped as a rectangle. If the center of the rectangle (for example, the intersection of the diagonals) is referred as a reference point, the position of the first series resonator S1 and that of the second series resonator S2 in the layout diagram may be substantially symmetrical. Specifically, the first series resonator S1 may be located at the upper left corner, the second series resonator S2 may be located at the lower right corner, and the two resonators are point-symmetrically arranged relative to the center of the first substrate 40. Specifically, the line connecting the center of the first series resonator S1 and the center of the second series resonator S2 may pass through the center of the first substrate 40. That is, the center of the first series resonator S1, the center of the second series resonator S2 and the center of the first substrate 40 may be substantially arranged along a virtual straight line. Furthermore, the distance between the center of the first series resonator S1 and the center of the first substrate 40 may be substantially equal to the distance between the center of the second series resonator S2 and the center of the first substrate 40.

Similarly, the third series resonator S3 and the fourth series resonator S4 may be substantially symmetrical as for their positions in the layout diagram. The fifth series resonator S5 and the sixth series resonator S6 may be substantially symmetrical as for their positions in the layout diagram. The first parallel resonator P1 and the second parallel resonator P2 may be substantially symmetrical as for their positions in the layout diagram. The third parallel resonator P3 and the fourth parallel resonator P4 may be substantially symmetrical as for their positions in the layout diagram. The fifth parallel resonator P5 and the sixth parallel resonator P6 may be substantially symmetrical as for their positions in the layout diagram. Furthermore, the capacitor C1 and the capacitor C2 may be substantially symmetrical as for their positions in the layout diagram.

In at least one radio frequency filter above, by providing the capacitors C1-C2 and the inductors L1-L3, unwanted RF signals may be effectively filtered out, and targeted RF signals may be substantially preserved. For example, the impact from high-frequency harmonics (e.g., second and/or third harmonics) may be eliminated or reduced. Further, lower out-band signals may be desirably filtered out. For example, a radio frequency filter according to an embodiment may be a band-pass filter, which may be preferably used for the n41 frequency band of 5G.

Furthermore, some features in at least one embodiment may be advantageously adjusted as desired by the target band. For example, the capacitance of the first capacitor C1 may be substantially equal to that of the second capacitor C2, and the inductance of the first inductor L1 may be substantially equal to the inductance of the second inductor L2. Furthermore, as for the equivalent capacitances, the resonant frequencies, and the positions in the layout, various series resonator S1-S6 may be substantially symmetrical. Additionally or alternatively, various parallel resonator P1-P6 may be substantially symmetrical as for the equivalent capacitances, the resonant frequencies, and the positions in the layout. Therefore, a RF filter may be configured for improved characteristics, such as improved zero-point performances.

Those skilled in the art will readily observe that numerous modifications and alterations of the device and method may be made while retaining the teachings of the invention. Accordingly, above disclosure should be construed as limited only by the metes and bounds of the appended claims.

What is claimed is:

1. A radio frequency filter, comprising:

a first transceiving terminal;

a second transceiving terminal;

a first series resonator coupled between the first transceiving terminal and the second transceiving terminal;

a second series resonator, coupled in series with the first series resonator between the first transceiving terminal and the second transceiving terminal;

at least one first parallel resonator, comprising a first terminal and a second terminal, wherein the first terminal of the at least one first parallel resonator is coupled to the first series resonator, and the second terminal of the at least one first parallel resonator is coupled to a first node;

at least one second parallel resonator, comprising a first terminal and a second terminal, wherein the first terminal is coupled to the first series resonator, and the second terminal of the at least one second parallel resonator is coupled to a second node;

a first capacitor, coupled in parallel with the at least one first parallel resonator;

a second capacitor, coupled in parallel with the at least one second parallel resonator;

a first inductor, comprising a first terminal and a second terminal, wherein the first terminal of the first inductor is coupled to the first transceiving terminal;

a second inductor, comprising a first terminal and a second terminal, wherein the first terminal of the second inductor is coupled to the second transceiving terminal; and a third inductor, comprising a first terminal and a second terminal, wherein the first terminal of the third inductor is coupled to the second terminal of the first inductor and coupled to the second terminal of the second inductor, and the second terminal of the third inductor is coupled to a reference node;

wherein the first series resonator has a first equivalent capacitance and a first resonant frequency, the second series resonator has a second equivalent capacitance and a second resonant frequency; and the first equivalent capacitance is substantially equal to the second equivalent capacitance, or the first resonant frequency is substantially equal to the second resonant frequency.

2. The radio frequency filter of claim 1, wherein the first inductor has a first inductance, the second inductor has a second inductance, and the first inductance is substantially equal to the second inductance.

3. The radio frequency filter of claim 1, further comprising:

a third series resonator, coupled in series between the first series resonator and the second series resonator; and a fourth series resonator, coupled in series between the third series resonator and the second series resonator.

4. The radio frequency filter of claim 3, wherein the third series resonator has a third equivalent capacitance, the fourth series resonator has a fourth equivalent capacitance, and the third equivalent capacitance is substantially equal to the fourth equivalent capacitance.

5. The radio frequency filter of claim 3, wherein the third series resonator has a third resonant frequency, the fourth series resonator has a fourth resonant frequency, and the third resonant frequency is substantially equal to the fourth resonant frequency.

6. The radio frequency filter of claim 3, further comprising:

a fifth series resonator, coupled in series between the third series resonator and the fourth series resonator; and a sixth series resonator, coupled in series between the fifth series resonator and the fourth series resonator.

7. The radio frequency filter of claim 6, wherein the fifth series resonator has a fifth equivalent capacitance, the sixth series resonator has a sixth equivalent capacitance, and the fifth equivalent capacitance is substantially equal to the sixth equivalent capacitance.

8. The radio frequency filter of claim 6, wherein the fifth series resonator has a fifth resonant frequency, the sixth series resonator has a sixth resonant frequency, and the fifth resonant frequency is substantially equal to the sixth resonant frequency.

9. The radio frequency filter of claim 1, wherein:

a first terminal of the first series resonator is coupled to the first transceiving terminal;

the first terminal of the at least one first parallel resonator is coupled to the first terminal of the first series resonator; and the radio frequency filter further comprises:

at least one third parallel resonator, comprising a first terminal and a second terminal, wherein the first terminal of the at least one third parallel resonator is coupled to a second terminal of the first series resonator, and the second terminal of the at least one third parallel resonator is coupled to a third node.

10. The radio frequency filter of claim 9, wherein:

a second terminal of the second series resonator is coupled to the second transceiving terminal;

the first terminal of the at least one second parallel resonator is coupled to the second terminal of the second series resonator; and the radio frequency filter further comprises:

at least one fourth parallel resonator, comprising a first terminal and a second terminal, wherein the first terminal of the at least one fourth parallel resonator is coupled to a first terminal of the second series resonator, and the second terminal of the at least one fourth parallel resonator is coupled to a fourth node.

11. The radio frequency filter of claim 10, wherein:

a position of the first series resonator and a position of the second series resonator in a layout are symmetrical;

a position of the at least one first parallel resonator and a position of the at least one second parallel resonator in the layout are symmetrical; and/or a position of the at least one third parallel resonator and a position of the at least one fourth parallel resonator in the layout are symmetrical.

12. A radio frequency filter, comprising:

a first transceiving terminal;

a second transceiving terminal;

a first series resonator coupled between the first transceiving terminal and the second transceiving terminal;

a second series resonator, coupled in series with the first series resonator between the first transceiving terminal and the second transceiving terminal;

at least one first parallel resonator, comprising a first terminal and a second terminal, wherein the first terminal of the at least one first parallel resonator is coupled to the first series resonator, and the second terminal of the at least one first parallel resonator is coupled to a first node;

at least one second parallel resonator, comprising a first terminal and a second terminal, wherein the first terminal is coupled to the first series resonator, and the second terminal of the at least one second parallel resonator is coupled to a second node;

a first capacitor, coupled in parallel with the at least one first parallel resonator;

a second capacitor, coupled in parallel with the at least one second parallel resonator;

a first inductor, comprising a first terminal and a second terminal, wherein the first terminal of the first inductor is coupled to the first transceiving terminal;

a second inductor, comprising a first terminal and a second terminal, wherein the first terminal of the second inductor is coupled to the second transceiving terminal; and a third inductor, comprising a first terminal and a second terminal, wherein the first terminal of the third inductor is coupled to the second terminal of the first inductor and coupled to the second terminal of the second inductor, and the second terminal of the third inductor is coupled to a reference node;

wherein:

the first series resonator, the second series resonator, the at least one first parallel resonator, the at least one second parallel resonator, the first capacitor and the second capacitor are disposed on a first substrate; and the first inductor, the second inductor and the third inductor are disposed on a second substrate.

13. The radio frequency filter of claim 1, further comprising:

a first matching circuit, coupled between the first transceiving terminal and the first series resonator; and a second matching circuit, coupled between the second transceiving terminal and the second series resonator.

14. The radio frequency filter of claim 1, further comprising:

a parasitic inductor present between the reference node and a reference voltage terminal.

15. A radio frequency filter, comprising:

a first transceiving terminal;

a second transceiving terminal;

a first series resonator coupled between the first transceiving terminal and the second transceiving terminal;

at least one first parallel resonator, comprising a first terminal and a second terminal, wherein the first terminal of the at least one first parallel resonator is coupled to the first series resonator, and the second terminal of the at least one first parallel resonator is coupled to a first node;

at least one second parallel resonator, comprising a first terminal and a second terminal, wherein the first terminal of the at least one second parallel resonator is coupled to the first series resonator, and the second terminal of the at least one second parallel resonator is coupled to a second node;

a first inductor, comprising a first terminal and a second terminal, wherein the first terminal of the first inductor is coupled to the first transceiving terminal;

a second inductor, comprising a first terminal and a second terminal, wherein the first terminal of the second inductor is coupled to the second transceiving terminal; and a third inductor, comprising a first terminal and a second terminal, wherein the first terminal of the third inductor is coupled to the second terminal of the first inductor and coupled to the second terminal of the second inductor, and the second terminal of the third inductor is coupled to a reference node;

wherein the first inductor has a first inductance, the second inductor has a second inductance, and the first inductance is substantially equal to the second inductance.

16. The radio frequency filter of claim 15, further comprising:

a second series resonator, coupled in series with the first series resonator between the first transceiving terminal and the second transceiving terminal.

17. The radio frequency filter of claim 15, further comprising:

a first capacitor, coupled in parallel with the at least one first parallel resonator; and a second capacitor, coupled in parallel with the at least one second parallel resonator.

* * * * *